United States Patent [19]
Iwasaki

[11] Patent Number: 5,173,926
[45] Date of Patent: Dec. 22, 1992

[54] CONVOLUTIONALLY-ENCODED QUADRATURE FREQUENCY-MODULATION SYSTEM

[75] Inventor: Ken Iwasaki, Tokyo, Japan

[73] Assignees: Communications Research Laboratory, Ministry of Posts and Telecommunications, Tokyo; Small Power Communication System Research Laboratories, Co., Ltd., Sendai, both of Japan

[21] Appl. No.: 691,833

[22] Filed: Apr. 26, 1991

[30] Foreign Application Priority Data

Apr. 26, 1990 [JP] Japan .................... 2-108864

[51] Int. Cl.$^5$ ............................. H04L 25/34
[52] U.S. Cl. ......................... 375/17; 341/43; 375/18
[58] Field of Search ............ 375/17, 37, 38, 48, 375/94, 57, 58; 371/43, 56; 341/57, 94

[56] References Cited

U.S. PATENT DOCUMENTS

| | | | |
|---|---|---|---|
| 4,493,082 | 1/1985 | Cumberton et al. | 371/43 |
| 4,606,027 | 8/1986 | Otani | 371/43 |
| 4,748,626 | 5/1988 | Wong | 375/17 |
| 4,802,174 | 1/1989 | Hiraiwa et al. | 371/46 |
| 4,837,766 | 6/1989 | Yoshida | 371/46 |

OTHER PUBLICATIONS

IEEE Transactions on Communications, vol. com-31, No. 2, pp. 290-295, Feb. 1983, P. J. McLane, "The Viterbi Receiver for Correlative Encoded MSK Signals".

"The Viterbi Receiver for Correlative Encoded MSK Signals", IEEE Transactions on Communications, vol. COM-31, No. 2, Feb. 1983, P. J. McLane.

*Primary Examiner*—Curtis Kuntz
*Assistant Examiner*—T. Ghebretinsae
*Attorney, Agent, or Firm*—Oblon, Spivak, McClelland, Maier & Neustadt

[57] ABSTRACT

A convolutionally-encoded quadrature frequency-modulation (CQFM) system of the present invention is a digital modulation system in which binary source data is encoded by a convolutional encoder with an encoding rate of $r=\frac{1}{2}$, quaternarized, and is then fed into a duobinary converter and a mod.4 mapper for subsequent quadrature frequency-modulation with a modulation index of $h=1$. The system has a soft-decision Viterbi decoder. This decoder has not only a symbol-metric calculator, a state-metric memory, a path-history memory, and ACS circuit, all used in an ordinary Viterbi decoding system, but also a signal location pointer, which is a memory indicating any one of the nominal signal points in a two-dimensional signal space and being updated in response to the selection of higher-likelihood by the ACS circuit. The soft-decision Viterbi decoder is able to decode data bits at a time by tracking trajectories of the transition between the states of the whole including the encoder and the duobinary converter through the aid of the signal location pointer.

3 Claims, 7 Drawing Sheets

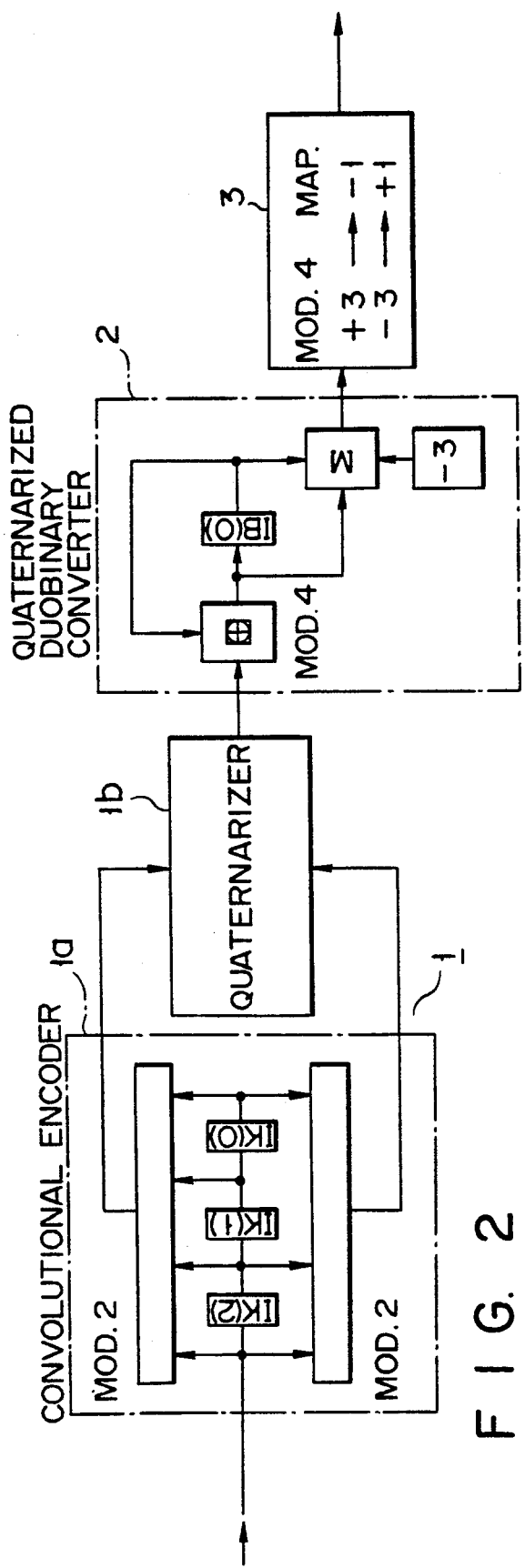
F I G. 2
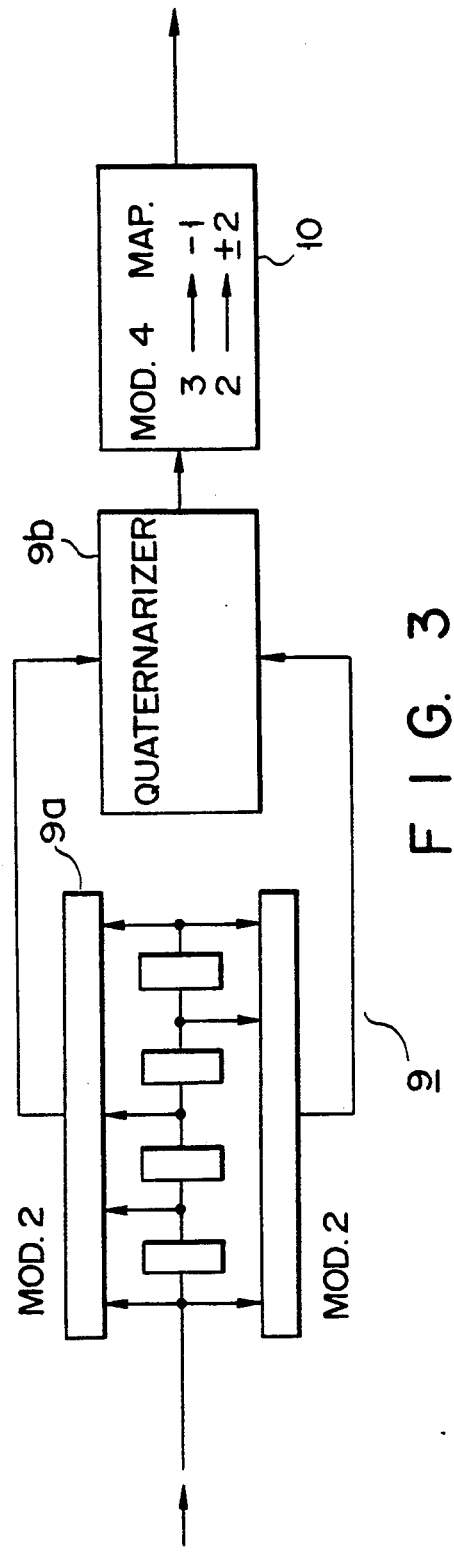
F I G. 3

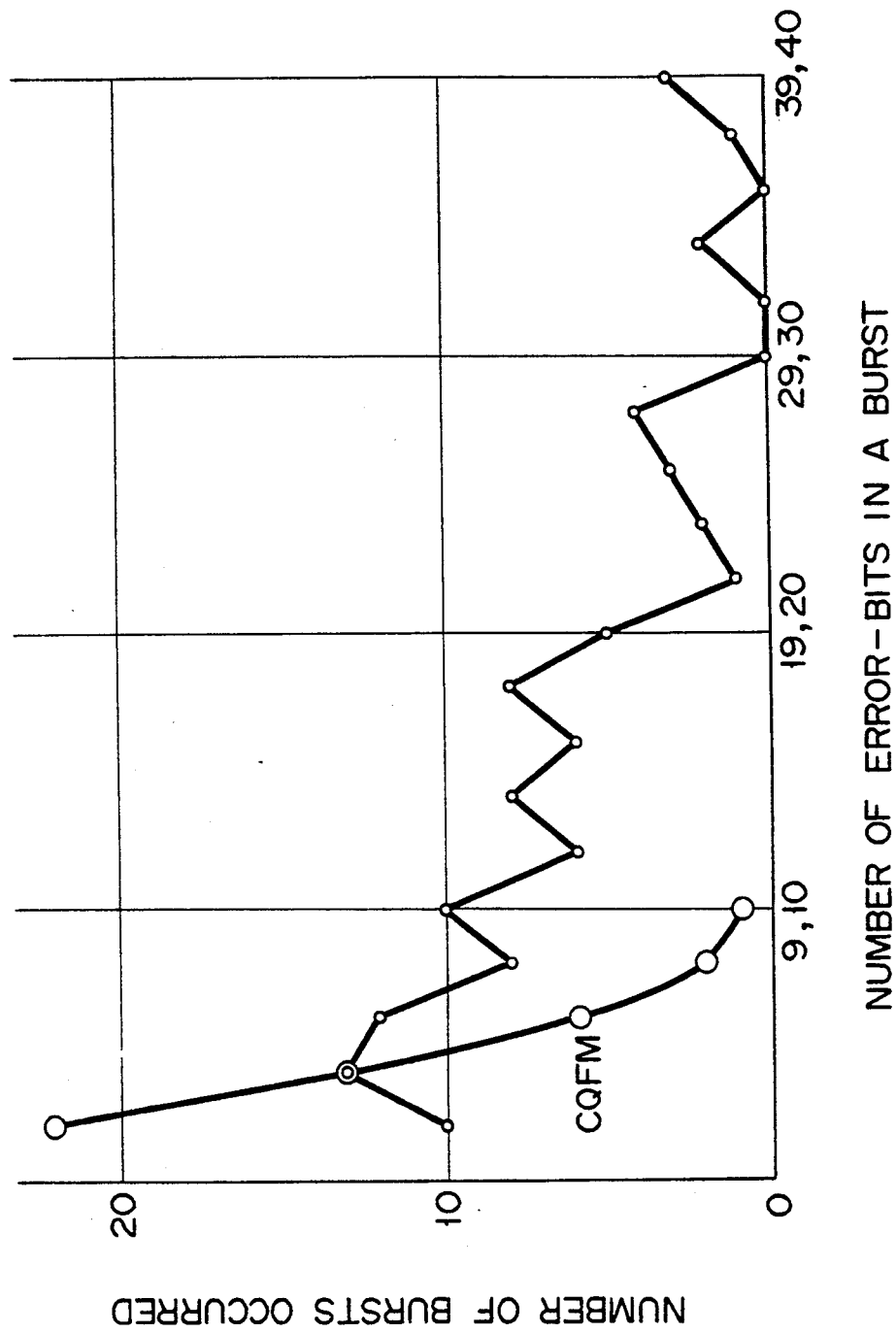
F I G. 4

DEFINITION OF STATES AND TRANSITION
BETWEEN STATES FOR CQFM

| STATE NO. | DEFINITION IK(2)(1)(0) IB(0) | | | | DEPARTING STATE NO. | INPUT DATA | OUTPUT DATA | ARRIVING STATE NO. |
|---|---|---|---|---|---|---|---|---|
| # 1 | 0 | 0 | 0 | E | # 1 | 0 | 1(+) | # 1 |
|   |   |   |   |   | # 3 | 0 | 3(−) | ” |
| # 2 | 0 | 0 | 0 | O | # 2 | 0 | 3(−) | # 2 |
|   |   |   |   |   | # 4 | 0 | 1(+) | ” |
| # 3 | 0 | 0 | 1 | E | # 6 | 0 | 0 | # 3 |
|   |   |   |   |   | # 8 | 0 | 2 | ” |
| # 4 | 0 | 0 | 1 | O | # 5 | 0 | 2 | # 4 |
|   |   |   |   |   | # 7 | 0 | 0 | ” |
| # 5 | 0 | 1 | 1 | E | #10 | 0 | 0 | # 5 |
|   |   |   |   |   | #12 | 0 | 2 | ” |
| # 6 | 0 | 1 | 1 | O | # 9 | 0 | 2 | # 6 |
|   |   |   |   |   | #11 | 0 | 0 | ” |
| # 7 | 0 | 1 | 0 | E | #13 | 0 | 1(+) | # 7 |
|   |   |   |   |   | #15 | 0 | 3(−) | ” |
| # 8 | 0 | 1 | 0 | O | #14 | 0 | 3(−) | # 8 |
|   |   |   |   |   | # 0 | 0 | 1(+) | ” |
| # 9 | 1 | 1 | 0 | E | #13 | 1 | 3(−) | # 9 |
|   |   |   |   |   | #15 | 1 | 1(+) | ” |
| #10 | 1 | 1 | 0 | O | #14 | 1 | 1(+) | #10 |
|   |   |   |   |   | # 0 | 1 | 3(−) | ” |
| #11 | 1 | 1 | 1 | E | #10 | 1 | 2 | #11 |
|   |   |   |   |   | #12 | 1 | 0 | ” |
| #12 | 1 | 1 | 1 | O | # 9 | 1 | 0 | #12 |
|   |   |   |   |   | #11 | 1 | 2 | ” |
| #13 | 1 | 0 | 1 | E | # 6 | 1 | 2 | #13 |
|   |   |   |   |   | # 8 | 1 | 0 | ” |
| #14 | 1 | 0 | 1 | O | # 5 | 1 | 0 | #14 |
|   |   |   |   |   | # 7 | 1 | 2 | ” |
| #15 | 1 | 0 | 0 | E | # 1 | 1 | 3(−) | #15 |
|   |   |   |   |   | # 3 | 1 | 1(+) | ” |
| # 0 | 1 | 0 | 0 | O | # 2 | 1 | 1(+) | # 0 |
|   |   |   |   |   | # 4 | 1 | 3(−) | ” |

E : EVEN  g(1) = 1 1 1 1
O : ODD   g(2) = 1 1 0 1

F I G. 6

CONVOLUTIONALLY-ENCODED QUADRATURE FREQUENCY-MODULATION SYSTEM

BACKGROUND OF THE INVENTION

1. Field of the Invention

The present invention relates to a coded modulation system suited for a poor channel in quality impaired by noise, interferences, and/or distortion such as a mobile, portable, or very small aperture terminal (VSAT) satellite communications channel.

2. Description of the Related Art

The duobinary frequency-modulation (DBFM) system with modulation index h=0.5 proposed by P. J. McLane, "The Viterbi receiver for correlative encoded MSK signals (IEEE Trans. Commun., COM-31, 2, pp. 290–295, Feb. 1983)," is known as a modulation system that possesses the constant envelope, compact spectrum, and almost the same BER performance as the antipodal modulation systems, i.e., BPSK, QPSK, and MSK.

The system combines the duobinary technique with the minimum-shift keying (MSK) and applies a soft-decision Viterbi decoding technique in order to demodulate the signals. However, DBFM has a few disadvantages as follows:

(1) DBFM necessitates block synchronization between the transmit and receive ends because DBFM applies alternatively two different state-transition tables in order to decode the signals.

(2) It is difficult for DBFM to employ bit-interleaving because DBFM utilizes the specific behavior of phasor in two-dimensional signal space.

(3) It is less effective for DBFM to connect tandem in trivial manner such a forward error correction (FEC) codec as a convolutional codec because DBFM already uses up a soft-decision Viterbi decoding of constraint length K=3.

SUMMARY OF THE INVENTION

The present invention provides a high-reliable and high-efficient digital communications channel, avoiding the above-mentioned disadvantages, by unifying a rate r=½ convolutional code into DBFM.

A convolutionally-encoded quadrature frequency-modulation (CQFM) system of the present invention comprises:

transmitting means including encoding means for convolutionally-encoding data from an information source with a rate r=½, quaternarizing means for quaternarizing two binary outputs from the encoding means, quaternarized duobinary-conversion means for converting the quaternary data from the quaternarizing means, mod.4 mapping means for mod.4-mapping the data from the conversion means, and modulation means for performing quadrature frequency-modulation with a modulation index of h=1; and receiving means including detecting means for detecting quadrature-coherently a signal from the transmitting means, symbol-metric calculating means for calculating symbol-metrics, and soft-decision Veterbi decoding means equipped with a signal location pointer, which is a memory of which contents indicate any one of the equally spaced four nominal signal points in a two-dimensional signal space and are updated at the same time as the contents of the path-history memory and state-metric memory are updated in accordance with the path selected by the ACS circuit, in order to decode source data at a time from the convolutionally-encoded quadrature frequency-modulated signal transmitted from said transmitting means by tracking trajectories of the transition between the states of the whole including the quaternarized duobinary means through the aid of said signal location pointer.

Additional objects and advantages of the invention will be set forth in the description which follows, and in part will be obvious from the description, or may be learned by practice of the invention.

BRIEF DESCRIPTION OF THE DRAWINGS

The accompanying drawings, which are incorporated in and constitute a part of the specification, illustrate presently preferred embodiments of the invention, and serve to explain the principles of the invention together with the general description given above and the detailed description of the preferred embodiments given below.

FIG. 2 is a block diagram illustrating an embodiment of the encoding part in FIG. 1 which employs a convolutional encoder with constraint length K=4;

FIG. 3 is another encoding part which has the same number of states S=16 with that of FIG. 2 but has no duobinary converter, being different from that of FIG. 2;

FIG. 4 shows the relation between the number of error-bits contained in an error-burst and the number of error-bursts occurred;

FIG. 6 illustrates definition of states and transition between states when the CQFM system of the present invention is applied to a convolutional code with constraint length K=4;

DETAILED DESCRIPTION OF THE PREFERRED EMBODIMENTS

Hereinafter an embodiment of the present invention will be described in detail with reference to the drawings.

Figure 1:
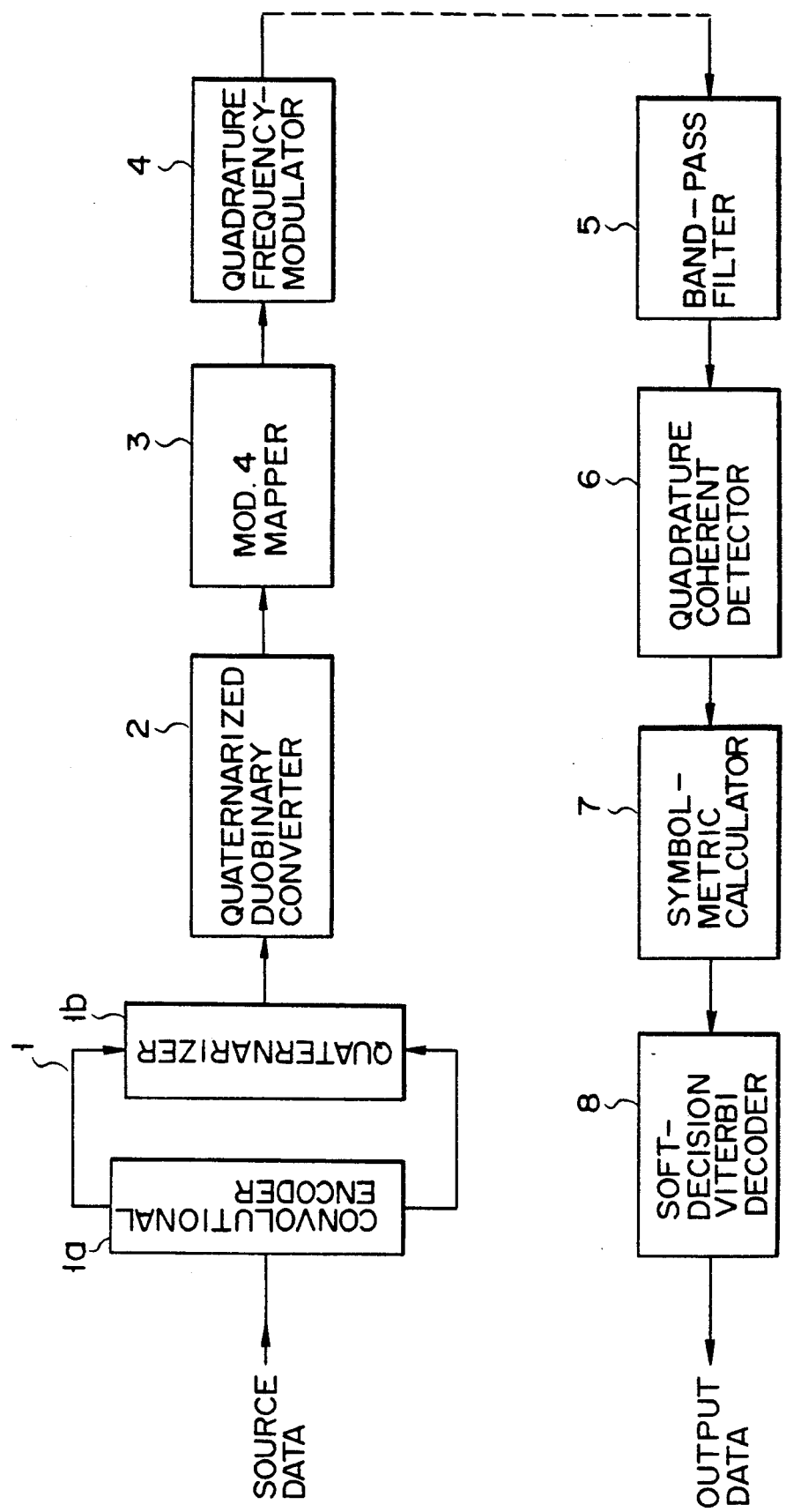
FIG. 1 is a block diagram embodying a CQFM system of the present invention.

FIG. 1 is a block diagram of a CQFM system according to the present invention.

At the transmitting end, a convolutional encoder/quaternarizer 1 with a rate r=½ is constructed of a convolutional encoder 1a for convolutionally encoding input data of 0s and 1s from an information source and a quaternarizer 1b for quaternarizing two binary data per source clock from 1a.

The quaternary output of the convolutional encoder/quaternarizer 1 is fed into a quaternarized duobinary converter 2 and a mod.4 mapper 3 of which output comes to any one of −1, 0, +1 and ±2.

In accordance with the output data of the mod.4 mapper 3, quadrature frequency-modulation with modulation index h=1 is performed.

At the receiving end, the CQFM signal is fed into a noise-limiting bandpass filter 5 and a quadrature coherent detector 6. Subsequently the signal is fed into a symbol-metric counter 7 where Euclidean distances d(0), d(1), d(2) and d(3) between a received signal point and the equally spaced four nominal signal points are calculated.

A soft-decision Viterbi decoder 8 employs the four Euclidean distances as symbol-metrics to decode the received signal.

Next, a specific arrangement of the encoding part of the CQFM system will be described with reference to FIG. 2.

As described above, the convolutional encoder/quaternarizer 1 is constructed of the convolutional encoder 1a and the quaternarizer 1b.

The tap coefficients of the codes used in the convolutional encoder 1a are 1111 and 1101 in FIG. 2. The quaternarizer 1b quaternarizes the two binary inputs as Gray code. Output data from the convolutional encoder/quaternarizer 1 is any one of 0, 1, 2 or 3.

The output data encoder/quaternarizer 1 is further converted to any one of $-1, 0, +1$ or $\pm 2$ by the quaternarized duobinary converter 2 and the mod.4 mapper 3.

The quaternarized duobinary converter 2 for quaternary input used herein refers to a converter in which mod.2 addition and addition of $-1$ in a conventional duobinary converter for binary input are replaced by mod.4 addition and addition of $-3$, respectively. The mod.4 mapper 3 maps inputs of $-3$ and $+3$ to $+1$ and $-1$, respectively.

FIG. 3 illustrates another encoding part which has the same number of states as the encoding part shown in FIG. 2 but which has no duobinary converter. Like the embodiment of FIG. 2, the encoding part shown in FIG. 3 is constructed from a convolutional encoder 9a and a quaternarizer 9b. The quaternary output is fed into a mod.4 mapper 10 which maps the quaternary data 3 and 2 to $-1$ and $\pm 2$, respectively.

The output of the mod.4 mapper being any one of 0, $+1$, $\pm 2$, and $-1$ is fed into a quadrature frequency-modulator. The behavior of phasor in a two-dimensional signal space at the output of the modulator is any one of staying at the same phase, shifting by $+\pi/2$, $\pm\pi$, and $-\pi/2$, corresponding to the modulator input of 0, $+1$, $\pm 2$, and $-1$, respectively.

FIG. 4 compares the performance of the system consisting of the encoding part in FIG. 2 with that of FIG. 3 under the same condition of $E_b/N_0 = 4$ dB and the length of the path-history memory of 21 bits. One corresponding to FIG. 3 decreases gradually in zigzag, whereas one corresponding to FIG. 2 decreases steeply and smoothly.

Figure 5:
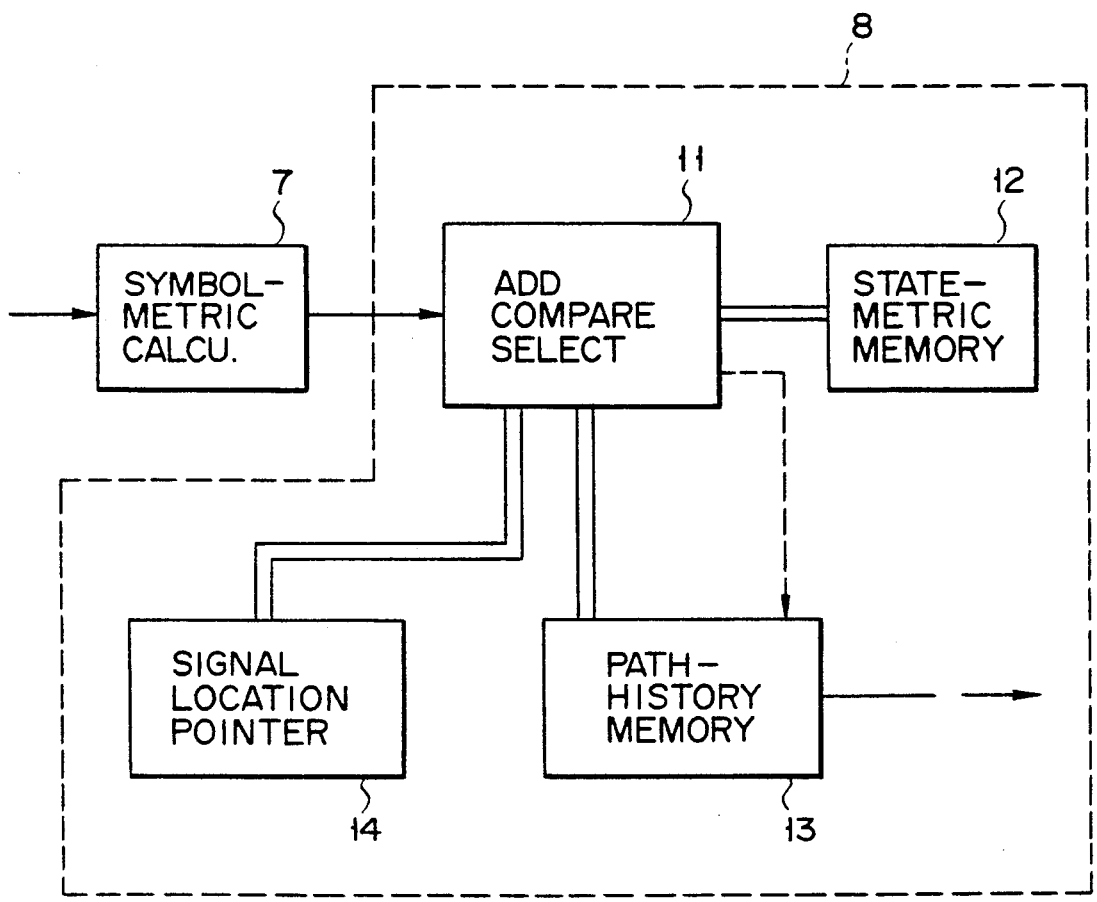
FIG. 5 is a block diagram illustrating a specific arrangement of the decoding part of FIG. 1.

Referring to FIG. 5, which illustrates the decoding end, output data of the quadrature coherent detector 6 shown in FIG. 1 is fed into the symbolic-metric calculator 7 which calculates four Euclidean distances d(0), d(1), d(2) and d(3) between a received signal point and four nominal signal points.

The soft-decision Viterbi decoder 8 is constructed of an ACS (ADD, COMPARE and SELECT) circuit 11, a state-metric memory 12, a path-history memory 13 and a signal location pointer 14.

The ACS circuit 11 adds the symbol-metrics to the state-metrics of the preceding states which rejoin to the same state, compares the amounts, selects a path that likelihood is higher, and also updates the state-metric memory and the path-history memory in accordance with the selected path. The ACS circuit, interating the process for every state, outputs the oldest bit in the path-history memory.

The present Viterbi decoder 8 for CQFM, moreover, provides the signal location pointer 14 corresponding to each path in the path-history memory 13 or each state in the state-metric memory 12. The signal location pointer indicates where the demodulated signal point is within the equally spaced four nominal signal points in a two-dimensional signal space and memorizes it. The signal location pointer is also updated in accordance with the selected path.

Let the distances between a received signal point and the four nominal signal points, denoted by *0, *1, *2, and *3 in counterclockwise, be d(0), d(1), d(2), and d(3), respectively. FIG. 6, for instance, shows that two states #14 and #0 at the preceding time arrive at the same state #8 accompanying the phase-shift of $-\pi/2$ and $+\pi/2$, respectively. When both signal location pointers corresponding to the states #14 and #0 indicate the same point *0, the next received signal should retard the pointer corresponding to #14 to *3, and should advance the pointer corresponding to #0 to *1, respectively. The decoder, hence, employs d(3) and d(1) as the symbol-metrics, respectively. Either of the paths is selected at the state #8 by ACS circuit which d(3) and d(1) are fed into. After interating the process for the every state, the decoder updates not only the state-metric memory and path-history memory but also the signal location pointer, and outputs the oldest bit in the path-history memory by the next signal input.

Figure 7:
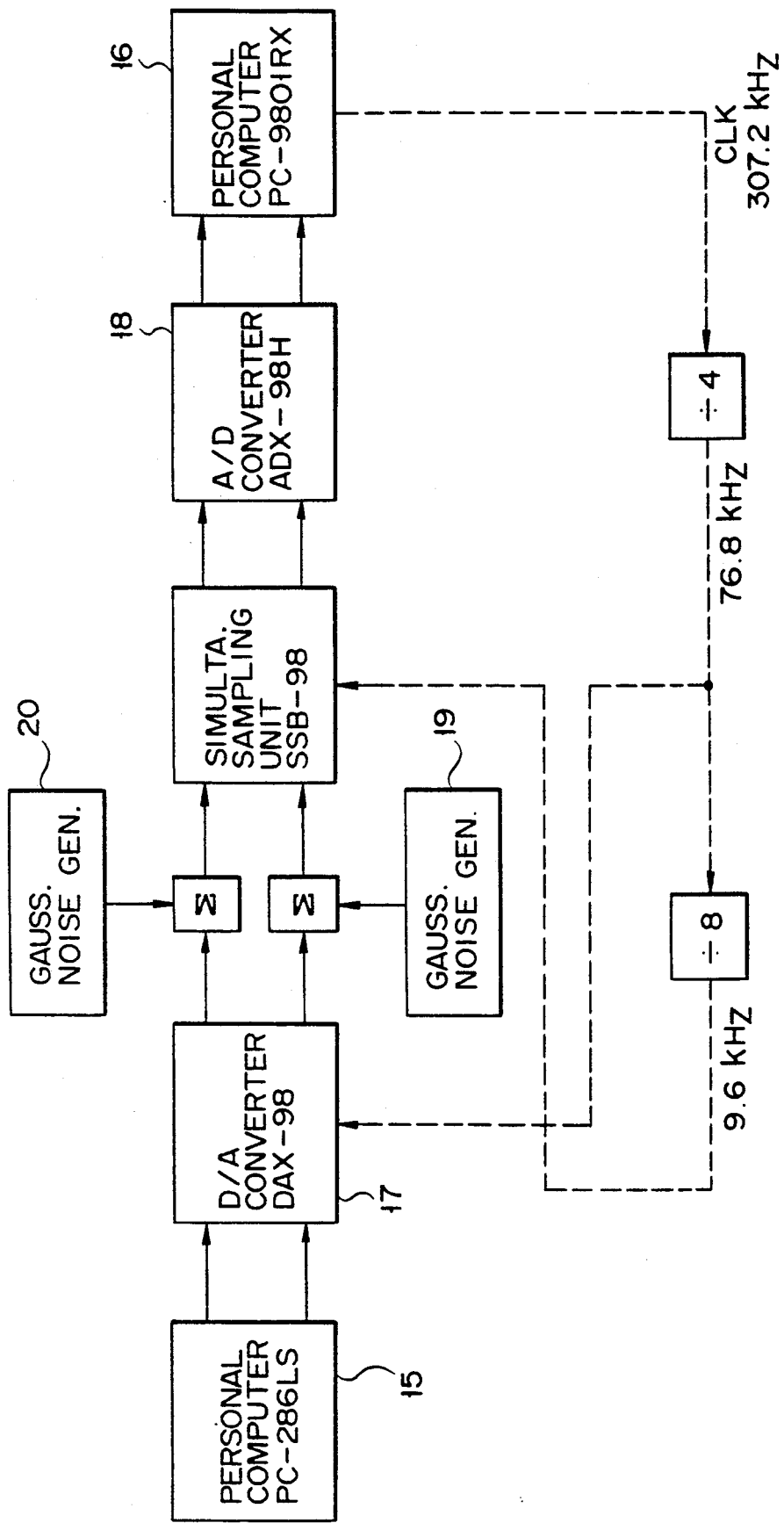
FIG. 7 is a diagram showing the connection of measuring members for measuring the $E_b/N_0$ vs. BER characteristics.

As illustrated in FIG. 7, personal computers 15 and 16, a digital-to-analog (D/A) converter 17, an analog-to-digital (A/D) converter 18 and Gaussian noise generators 19 and 20 were connected in order to measure the $E_b/N_0$ vs. BER characteristics.

The computer at the transmitting end produced transmit data and waveforms in an equivalent baseband-transform and fed them into the D/A converter as electric signals. Noise from the Gaussian noise generators was added to the output signal of the transmitting end, and the resultant signal was fed into the receiving computer via the noise-limiting LPF and the A/D converter where sampling clocks were directly supplied from the transmitting end to the receiving end. The receiving computer performed the signal processing described above to decode the data. The receiving computer made a comparison between the receive data and the transmit data and counted error pulses. The BER was calculated from the ratio of the number of the error pulses to the total number of the transmit data.

Figure 8:
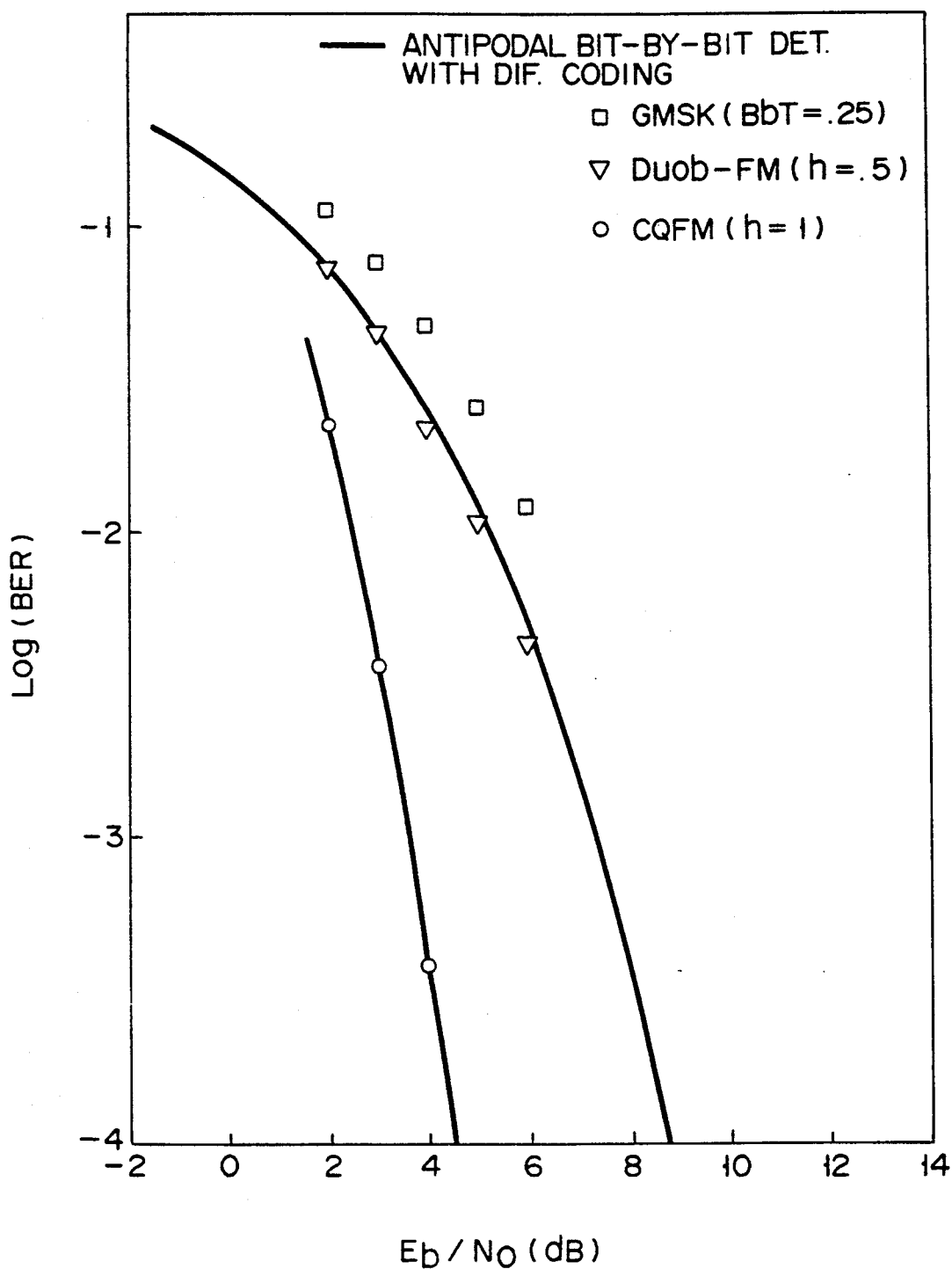
FIG. 8 shows the $E_b/N_0$ vs. BER characteristics of the system of the present invention (indicated by o) which was implemented on the basis of the arrangements of FIGS. 2, 5 and 6, in comparison with those of other systems (indicated by ∇ and ).

In order to show the validity of the measurement, FIG. 8 shows measured values also for the DBFM ststem and the GMSK system of which cutoff-frequency of the premodulation low pass filter was set at $B_bT = 0.25$.

Coding gains of 2.7 dB, 3.7 dB and 4.2 dB can be seen from FIG. 8 for BER = 1%, 0.1% and 0.01%, respectively, on condition that the path-history memory length was fixed at 21 bits. Error-pulses were generated in a very burst-like mode when an erroneous path was selected by the Viterbi decoder. According to the present results of the measurement, the number of error-pulses per error-burst was 1 to 28 and the average was 5.5 for $E_b/N_0 = 3$ dB. Also, when $E_b/N_0 = 4$ dB, the number of error-pulses per burst was 1 to 10 and the average was 3.4.

As described above in detail, the CQFM system of the present invention has the following advantages:

(a) Since information is transmitted in the form of variations in the phase of a carrier, there is no need for the absolute phase of a reference carrier necessitated for coherent detection. In other words, $\pm \pi/2$ phase ambiguity of the reference carrier is allowed.

(b) Block synchronization is not required.

(c) The clock rate for transmission and reception may be the same as the information bit rate, but the modulation index h is doubled.

(d) By connecting an interleaver and a deinterleaver to the inputs of the quadrature frequency-modulator and the symbol-metric calculator, respectively, it is possible for CQFM system to employ bit-interleaving.

It will be expected that, the CQFM system is effective against what is referred to as multipath distortion and interferences because information is transmitted in the form of variations of the phase of a carrier.

What is claimed is:

1. A convolutionally-encoded quadrature frequency-modulation (CQFM) system comprising:
   encoding means for convolutionally-encoding data from an information source with a rate $r=\frac{1}{2}$;
   quaternarizing means for quaternarizing two binary outputs from said encoding means to produce a quaternary data;
   conversion means for duobinarilly-converting the quaternary data from said quaternarizing means;
   mod.4 mapping means for mod.4-mapping the converted data from said conversion means;
   modulation means for quadrature frequency-modulating a carrier with output data from said mod.4 mapping means;
   detecting means for detecting coherently a received quadrature frequency-modulated signal;
   symbol-metric calculating means for calculating Euclidean distances between a received signal point and four nominal signal points in a two-dimensional signal space; and
   soft-decision Viterbi decoding means equipped with a signal location pointer, which is a memory of which contents indicate any one of the nominal signal points and are updated at the same time as the contents of the path-history memory and the state-metric memory are updated in accordance with the path selected by the ACS circuit, in order to decode source data at a time from said quadrature frequency-modulated signal by tracking trajectries of the transition between the states of the whole including said encoding means and converting means through the aid of said signal location pointer.

2. A system according to claim 1, in which said quaternarizing means is a quaternarizer that quaternarizes two binary data from said encoding means as Gray code.

3. A system according to claim 1, in which said conversion means is a converter in which the mod.2 addition and addition of $-1$ in a conventional duobinary converter for binary inputs are replaced by mod.4 addition and addition of $-3$, respectively, and said mod.4 mapping means maps $-3$ and $+3$ to $+1$ and $-1$, respectively.

* * * * *